(12) United States Patent
Yanagidaira et al.

(10) Patent No.: US 7,738,276 B2
(45) Date of Patent: Jun. 15, 2010

(54) SEMICONDUCTOR DEVICE AND METHOD FOR MANUFACTURING

(75) Inventors: Kosuke Yanagidaira, Fujisawa (JP); Takuya Futatsuyama, Yokohama (JP); Toshiya Kotani, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 12/169,270

(22) Filed: Jul. 8, 2008

(65) Prior Publication Data
US 2009/0014841 A1      Jan. 15, 2009

(30) Foreign Application Priority Data
Jul. 9, 2007   (JP) .............................. 2007-179240

(51) Int. Cl.
*G11C 5/02* (2006.01)
(52) U.S. Cl. .................... 365/51; 365/52; 365/226
(58) Field of Classification Search ............... 365/51, 365/52, 226, 185.17
See application file for complete search history.

(56) References Cited

U.S. PATENT DOCUMENTS 6,128,208 A * 10/2000 Itoh et al. .................... 365/51
6,404,661 B2 * 6/2002 Hidaka ........................ 365/63
6,824,933 B2   11/2004 Kanaya
2006/0197136 A1   9/2006 Futatsuyama et al.
2008/0084728 A1   4/2008 Sakuma et al.

OTHER PUBLICATIONS

Woo-Yung Jung et al.,"Patterning with spacer for expanding the resolution limit of current lithography tool", Proc. of SPIE, vol. 6156, 61561J-1, (2006), 9 Pages.
JW Park et al.,Robust Double Exposure Flow for Memory, Proc. SPIE, vol. 6154, 61542E-1, (2006), 10 Pages.

* cited by examiner

*Primary Examiner*—Huan Hoang
(74) *Attorney, Agent, or Firm*—Oblon, Spivak, McClelland, Maier & Neustadt, L.L.P.

(57) ABSTRACT

A first region having a first pattern which includes a first minimum dimension, a second region having a second pattern which includes a second minimum dimension larger the first minimum dimension, the second region being arranged adjacent to the first region, wherein a boundary between the first region and the second region is sectioned by a width which is twice of more of a minimum dimension which exists in an adjacent region.

15 Claims, 17 Drawing Sheets

| Example of minimum dimension (nm) | | |
|---|---|---|
| Cell region | Connection region | Peripheral circuit region |
| 70 | 70 | 100 |
| 50 | 70 | 100 |
| 40 | 50 | 100 |
| 30 | 40 | 100 |

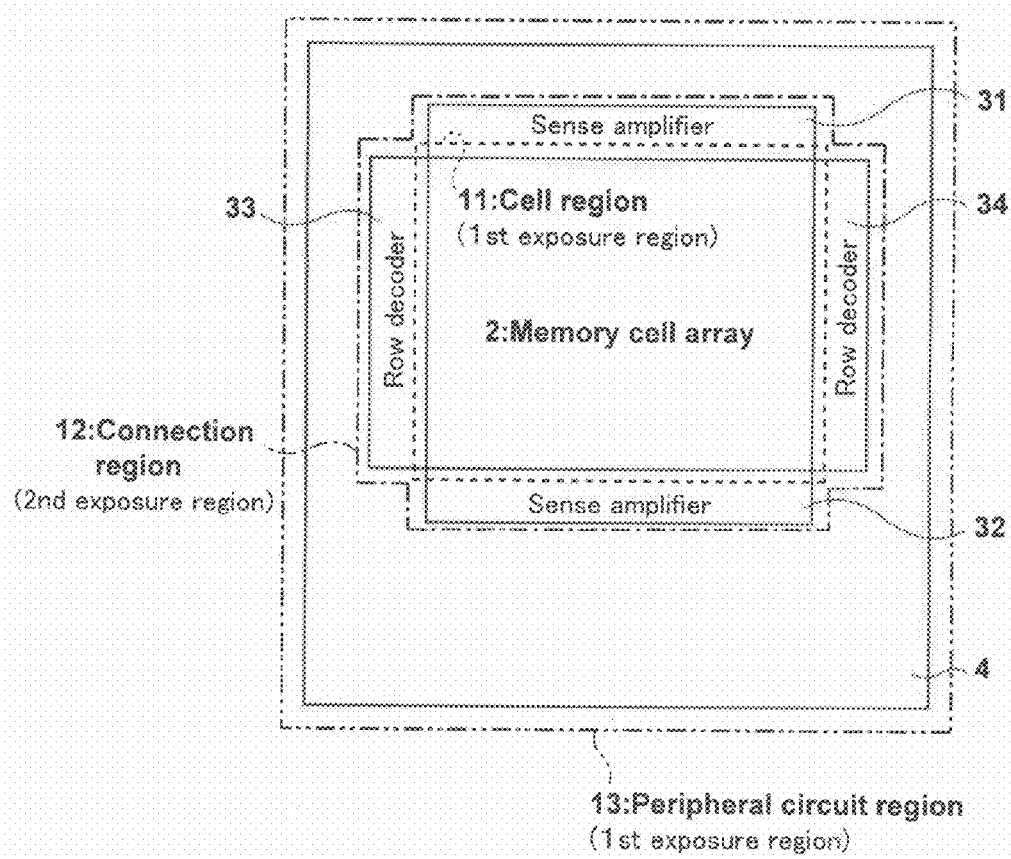

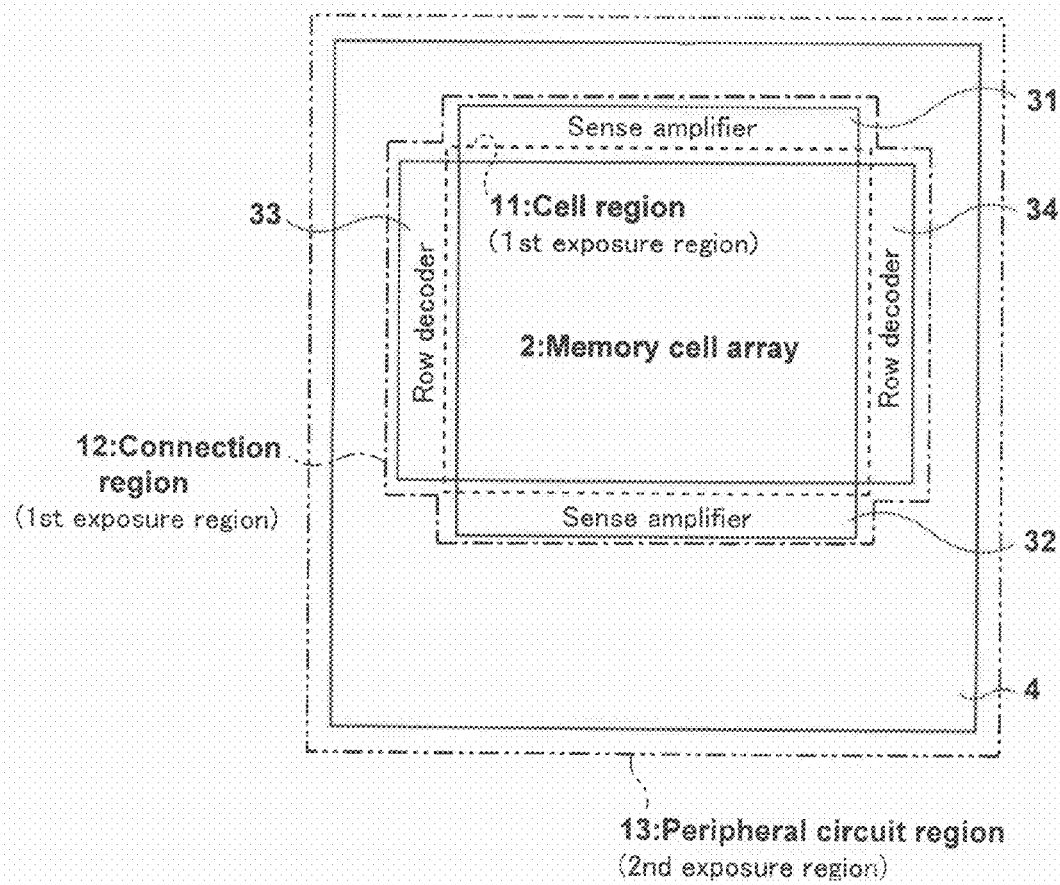

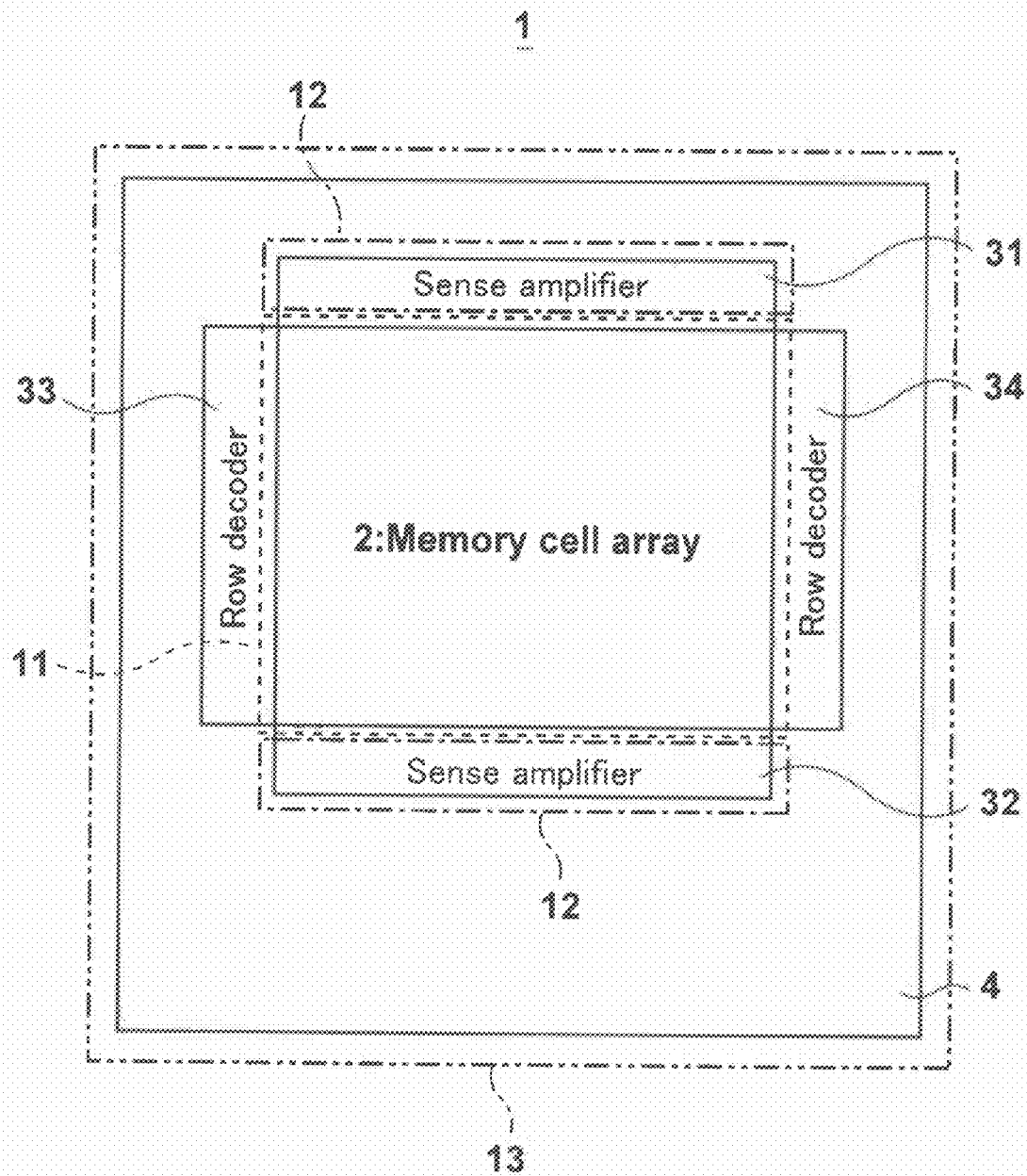

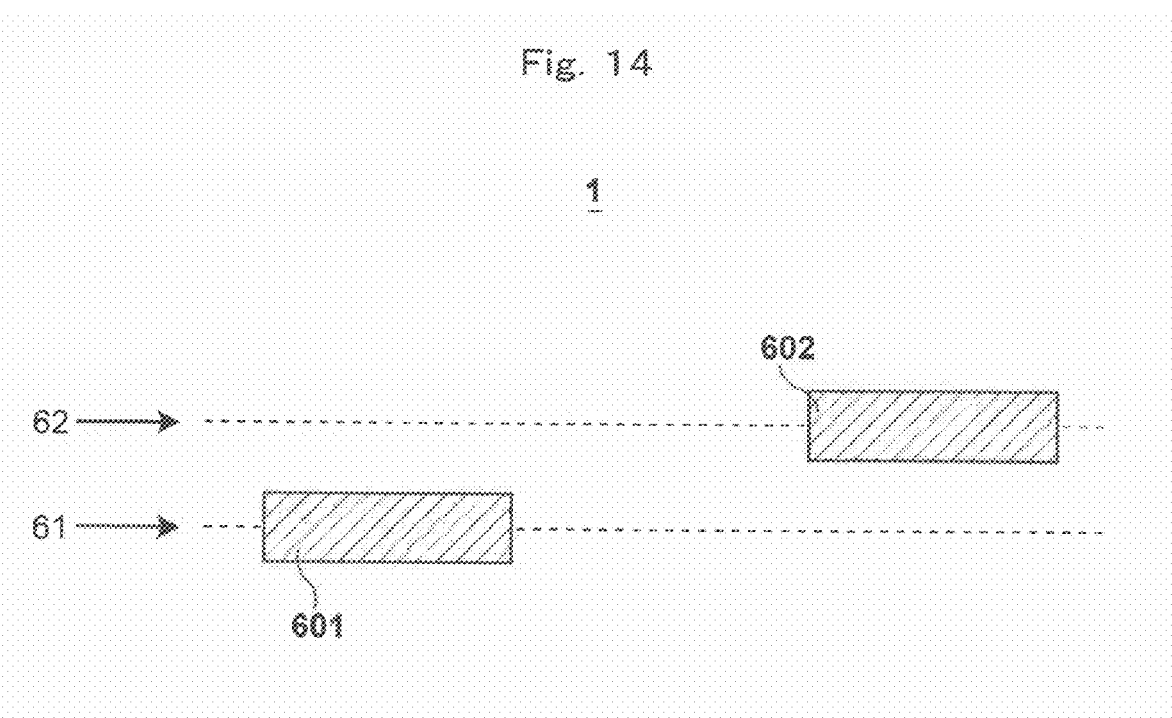

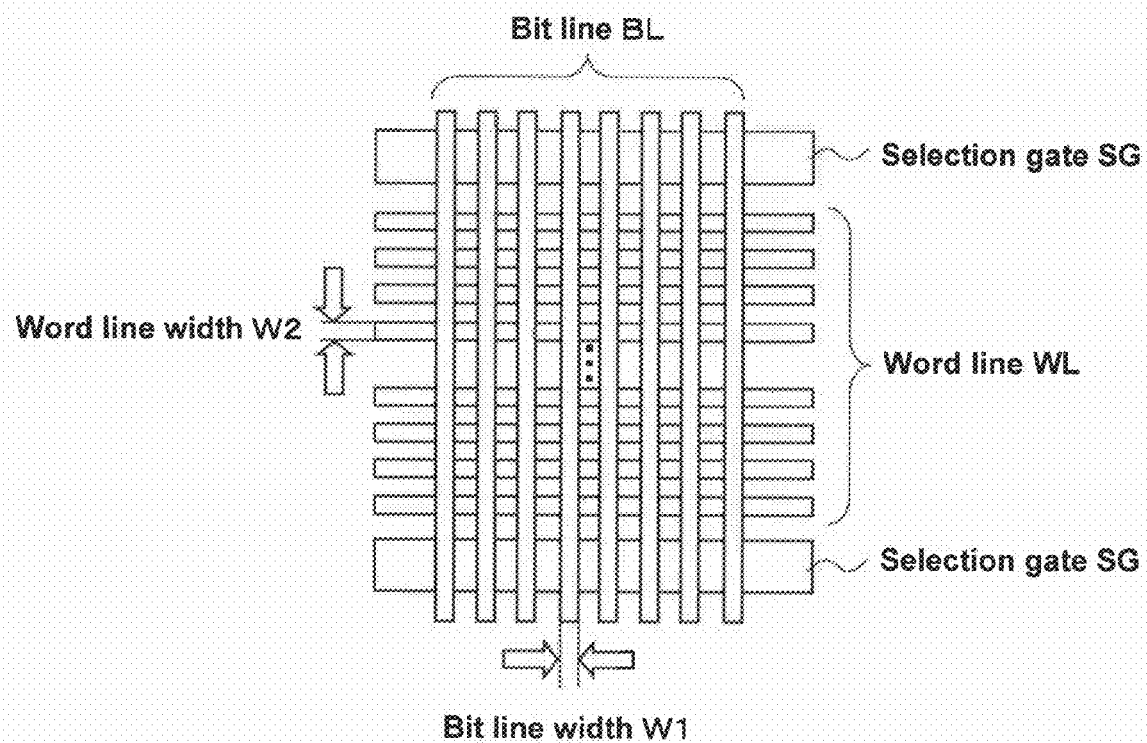

SEMICONDUCTOR DEVICE AND METHOD FOR MANUFACTURING

CROSS REFERENCE TO RELATED APPLICATION

This application is based upon and claims the benefit of priority from the prior Japanese Patent Application No. 2007-179240, filed on Jul. 9, 2007, the entire contents of which are incorporated herein by reference.

BACKGROUND OF THE INVENTION

1. Field of the Invention

This invention is related to a semiconductor device and a manufacturing method of the same, and in particular to a semiconductor device manufactured by multiple exposure technology and a manufacturing method of a semiconductor device which includes multiple exposure technology.

2. Description of the Related Art

Multiple exposure technology is known among semiconductor device manufacturing technologies. Multiple exposure technology is a technology in which one layout is divided into at least two or more sub-patterns and exposure is performed after separating exposure conditions for each sub-pattern. As an example of multiple exposure technology, there is a method disclosed in J. W. Park et al., "Robust double exposure flow for memory", Proc. of SPIE, Vol. 6154, 61542E (2006). Because a buffer region in which misalignment during manufacturing is considered is necessary on a boundary between a sub-pattern and another sub-pattern, as the number of sub-patterns and buffer regions increase, the semiconductor chip area also increases. In addition, if division of a sub-pattern is not optimally performed, an exposure margin decreases leading to a decrease in yield ratios.

However, as a miniature formation technology which exceeds the resolution limits of lithography, side wall processing is known. As an example of this side wall processing, a method is disclosed in "Patterning with spacer for expanding the resolution limit of current lithography tool", Proc. of SPIE, Vol. 6156, 61561J (2006) by W. Y. Jung et al. Side wall processing is a process which can process the finished dimensions of a pattern to below half of an exposure dimension. There are limitations to layout pattern which can be processed by said wall processing and if a circuit pattern is created which is not appropriate for side wall processing, exposure and process margins decrease leading to a decrease in yield ratios as well as an increase in the area of a semiconductor chip.

BRIEF SUMMARY OF THE INVENTION

The semiconductor device related to an embodiment of the present invention is arranged with a first region which includes a first pattern having a first minimum dimension, and a second region which includes a second pattern having a second minimum dimension which is larger than said first minimum dimension, said second region being arranged adjacent to said first region, and a boundary between said first region and said second region is sectioned by a width which is twice or more the minimum dimension which exists in a region adjacent to said boundary.

The semiconductor device related to an embodiment of the present invention is arranged with a first region which includes a first pattern having a first minimum dimension, a second region which includes a second pattern having a second minimum dimension, said second region being arranged adjacent to said first region, and a third region which includes a third pattern having a third minimum dimension which is larger than said second minimum dimension, said third region being arranged adjacent to said first region or said second region, and a boundary which is arranged between said first region and said second region, or between said first region and said third region, or between said second region and said third region being any one of the following;

(1) a boundary of each of said first region, said second region and said third region respectively is sectioned by a width which is twice or more the minimum dimension which exists in a region adjacent to said boundary.
(2) a boundary of said first region and said third region with said second region is sectioned by a width which is twice or more the minimum dimension which exists in a region adjacent to said boundary.
(3) a boundary of said first region and said second region with said third region is sectioned by a width which is twice or more the minimum dimension which exists in a region adjacent to said boundary.

The semiconductor device related to an embodiment of the present invention is arranged with a boundary of a region of a first layer, a boundary of a region of a second layer which is arranged on a layer above said first layer wherein each of said boundary of said region of said first layer and said boundary of said region of said second layer each alternately arranged from a bottom layer to a top layer respectively and said boundary of said region of said first layer and said boundary of said region of said second layer are sectioned by a width of twice or more a minimum dimension which exists in an adjacent region.

BRIEF DESCRIPTION OF THE DRAWINGS

FIG. 9 is a diagram which shows one example of each exposure region related to a second exposure method of a NAND type flash memory related to a first embodiment.

FIG. 11 is a diagram which shows one example of each exposure region related to a third exposure method of a NAND type flash memory related to a first embodiment.

FIG. 12 is a layout diagram of a NAND type flash memory chip related to a second embodiment of the present invention.

FIG. 14 is an outline structural diagram which shows an exposure region of the main parts of a NAND type flash memory related to a third embodiment of the present invention.

FIG. 15 is a diagram which shows one example of a minimum dimension within a cell region of a NAND type flash memory related to a first embodiment

DETAILED DESCRIPTION OF THE INVENTION

Figure 1:
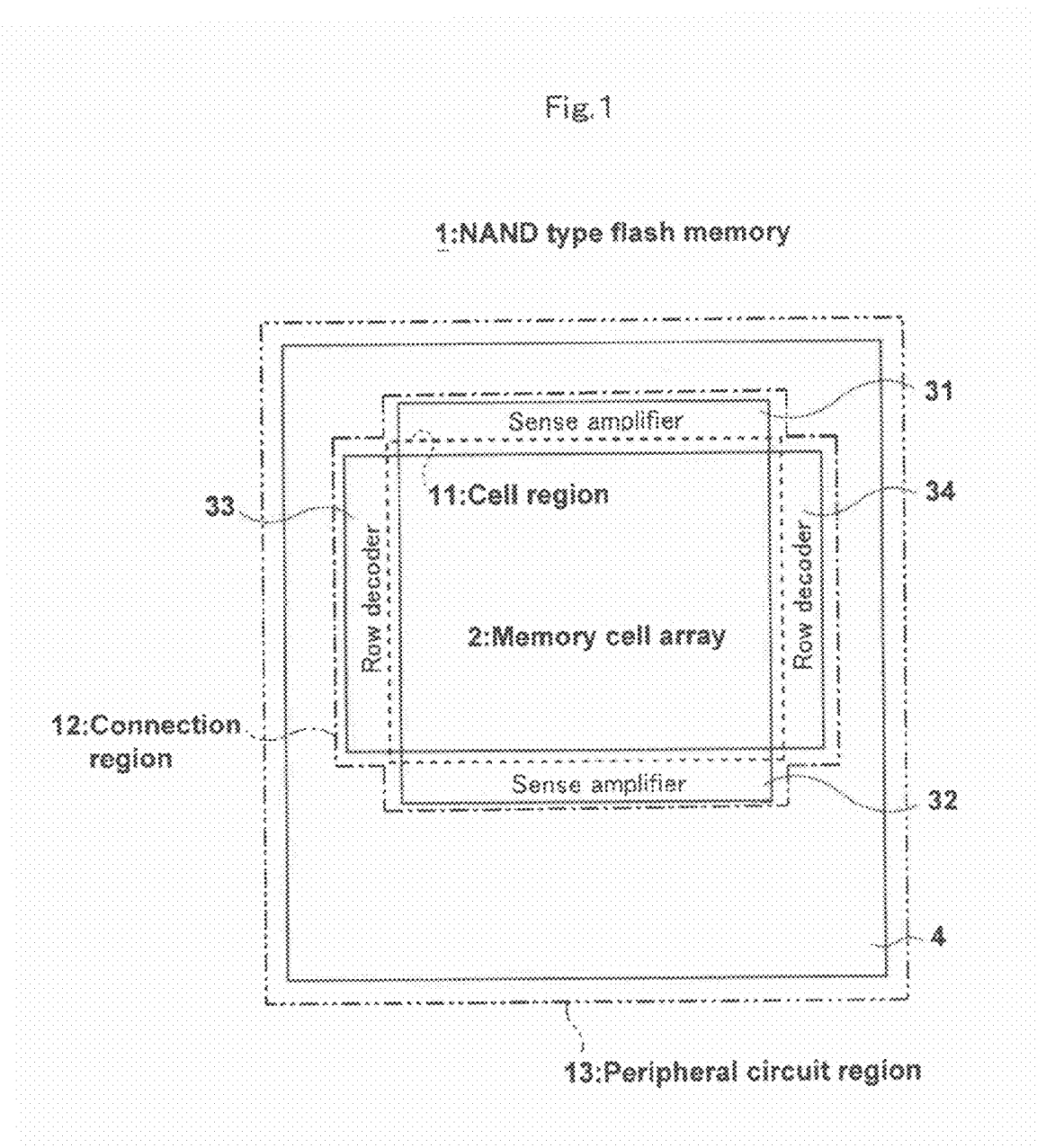
FIG. 1 is layout diagram of a NAND type flash memory chip related to a first embodiment of the present invention.

The embodiments of the present invention will be explained below while referring to the diagrams. The semiconductor device related to the embodiments will be explained using a NAND type flash memory. Furthermore, the same structural components have the same symbols and thus overlapping explanations between embodiments will be omitted.

First Embodiment

The first embodiment of the present invention explains a multiple exposure method in a manufacturing method of a NAND type flash memory.

Multiple exposure technology is also used in manufacturing technology of a NAND type flash memory in which high integration and large capacity is demanded. Exposure dimensions in an exposure process in manufacturing technology of a NAND type flash memory is common with the finished dimensions of a NAND type flash memory after processing. A cell region has the smallest exposure dimensions, a peripheral circuit region has the largest dimensions and an intermediary region is a connection region between the cell region and the peripheral circuit region.

The cell region is a memory cell array in which memory cell units are arranged in matrix. The memory cell units in the memory cell array are arranged in a matrix. The memory cell unit is arranged with a memory string, a source side selection transistor which electrically connects one end of a memory string and a source line and a drain side selection transistor which electrically connects the other end of a memory string and a data line. The memory string is structured by electrically connecting in series a plurality of memory cells. A transistor having a charge storage region is used in a memory cell. A bit line is electrically connected to the drain side selection transistor of a memory cell unit. A source line is electrically connected to the source side selection transistor of a memory cell unit. A word line is electrically connected to each memory cell of a memory string respectively.

A bit line extraction wiring part from a memory cell array, a word line extraction wiring part from a memory cell array, a sense amplifier and a row decoder are included in the connection region. The peripheral circuitry includes a power supply circuit and so on without a sense amplifier and a row decoder.

In manufacturing technology of a NAND type flash memory, when the exposure conditions are optimized for the cell region which has the smallest exposure dimensions, an absolute value of the variation in dimensions which are permitted at the exposure stage becomes narrower in the following order, cell region, connection region and peripheral circuit region. Because there is a dependent relationship between the exposure dimensions and an allowable absolute value of a variation in dimensions, the absolute value of a variation in dimensions which is permitted at the exposure stage matches a tendency of the dimension variation which is demanded at completion. At this time, special exposure conditions are applied to only the cell region which has a minimum line width and the exposure method has two methods. The first exposure method is an exposure method which can expose the cell region, connection region and peripheral circuit region all together if the design rules demanded by the connection region and the peripheral circuit region can be encompassed with the exposure conditions of the cell region. The second exposure method is an exposure method whereby the exposure conditions of the cell region are special exposure conditions and in the case where the design rules demanded by the connection region and the peripheral circuit region can not be encompassed, the exposure process is divided into two processes, a cell region exposure process and a connection region and peripheral circuit region exposure process.

There is a k1 factor in one definition which shows the level of difficulty of an exposure process of a semiconductor device. Here, the k1 factor is generally expressed as a formula and as the value becomes smaller the level of difficulty increases. (k1=pattern size*numerical aperture (NA)/wavelength of laser exposure). A shift in the k1 factor tends to go decrease as the minimum exposure dimensions become smaller (see FIG. 4). When the k1 factor is below 0.3, it becomes difficult to secure an exposure margin even if an OPC (Optical Proximity Correction) is used, and when below 0.25 resolution of a pattern becomes impossible.

In the NAND type flash memory, the exposure dimensions in the case where side wall processing is adopted for only the cell region, finished dimensions double. Therefore, the exposure dimensions become large in the following order, connection region, cell region and peripheral circuit region. When the exposure conditions are optimized for the connection region which has the minimum dimensions, the absolute value of variation in dimensions which is permitted at the exposure stage inevitably becomes narrower in the following order, connection region, cell region and peripheral circuit region. However, after completion via the processing stage, because the finished dimensions of the cell region become the smallest, the demanded level of accuracy of the dimensions is matched with the finished dimensions and there is a need to narrow the dimensions in the following order, cell region, connection region and peripheral circuit region. A contradiction is generated between the exposure dimensions and the variation in dimensions permitted in completion. This means that an allowable value of exposure dimensions and an allowable value of dimension variation are independent.

As a result, in multiple exposure technology, the level of difficulty of lithography technology increases with a drop in the k1 factor, and because the exposure margin decreases in exposure processing, a specialized exposure condition is required for each of the connection region which has the minimum exposure dimension, and the cell region which has the minimum allowable variation in exposure dimensions respectively. The specialized exposure condition defines particular rules in line with exposure conditions to each of the cell region and the connection region even at the design stage.

[NAND Type Flash Memory Layout Structure]

The NAND type flash memory 1 (semiconductor device) related to the first embodiment of the present invention, is arranged with a cell region (first region) 11, a connection region (second region) 12 and a peripheral circuit region (third region) 13 as shown in FIG. 1.

In FIG. 1, the region enclosed by a dotted line is the cell region 11. The cell region 11 is a region in which memory cells are arranged in matrix in a memory cell array 2. The cell region 11 includes a first pattern having a first minimum processing dimension in this NAND type flash memory 1 (semiconductor chip). In FIG. 1, the region which is enclosed by a single dot dashed line excluding the cell region 11 is the connection region 12. The connection region 12 includes a sense amplifier 31 and a sense amplifier 32 of the NAND type flash memory 1 which are arranged along the top area of the memory cell array 2 and the bottom area which faces the top area respectively, and a row decoder 33 and a row decoder 34 of the NAND type flash memory 1 which are arranged along the left area of the memory cell array 2 and the right area which faces the left area respectively. The connection region 12 is arranged adjacent to the cell region 11 (first region), and includes a second pattern having a second minimum processing dimension which is larger than a first minimum processing dimension. In FIG. 1, the region which is enclosed by a two-dot dashed line excluding the cell region 11 and the connection region 12 is the peripheral circuit region 13. The peripheral circuit region 13 (third region) is arranged on the periphery of the connection region 12 and includes a power supply circuit (including a charge pump circuit and step-down circuit), a temperature compensating circuit and a clock generator circuit of the NAND type flash memory 1. The peripheral circuit region 13 is arranged adjacent to the first region or the second region and includes a third pattern having a third minimum processing dimension which is larger than the second minimum processing dimension. In the NAND type flash memory 1 (semiconductor device) of the present invention related to this embodiment, the boundaries of the first, second and third regions are each as one of the following respectively.

(1) a boundary of each of the first region, the second region and the third region respectively is sectioned by a width which is twice or more the minimum processing dimension which exists in a region adjacent to the boundary (a periphery of a boundary of each of the first region, the second region and the third region respectively is sectioned by a space having a width which is twice or more the minimum processing dimension which exists in a region adjacent to the boundary).

(2) a boundary of the first region and the third region with the second region is sectioned by a width which is twice or more the minimum processing dimension which exists in a region adjacent to the boundary (a periphery of a boundary of the first region and the third region with the second region is sectioned by a space having a width which is twice or more the minimum processing dimension which exists in a region adjacent to the boundary).

(3) a boundary of the first region and the second region with the third region is sectioned by a width which is twice or more the minimum processing dimension which exists in a region adjacent to the boundary (a periphery of a boundary of the first region and the second region with the third region is sectioned by a space having a width which is twice or more the minimum processing dimension which exists in a region adjacent to the boundary).

Furthermore, in each of the embodiments below, the above stated boundary (boundary region) is separated from an adjacent region (first region and second region, second region and third region), and are separated as a boundary closed from a second region and third region which adjoin the first region and second region.

[Circuit Structure of a Memory Cell Array of a NAND Type Flash Memory]

Figures 2, 3:
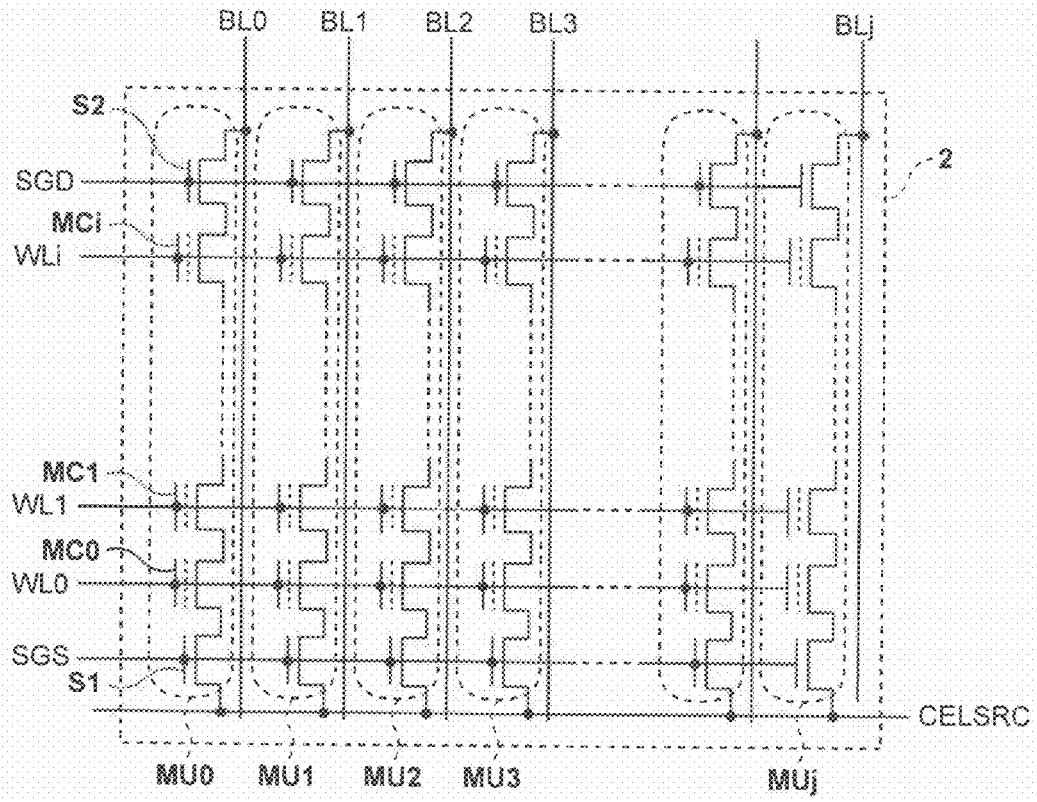
FIG. 2 is a circuit structural diagram of a memory array of the NAND type flash memory shown in FIG. 1.
FIG. 3 is a diagram which shows a minimum processing dimension of each generation of a NAND type flash memory for explaining a first embodiment.

The memory cell array 2 is formed by arranging a plurality of parallel memory cell units MU0, MU1, ... MUj as shown in FIG. 2. Here, although only one part of the memory cell units MU is shown in the diagram, actually the memory cell units MU0-MUj are further arranged in a matrix. The memory cell units MU0-MUj each include a plurality of memory cells MC0, MC1, ... MCi and this plurality of memory cells MC0, MC1 ... MCi form a memory string. The number of connecting memory cells MC is set based on, for example, an 8, 16, 32 byte structure.

In the first embodiment, one memory cell MC includes at least a charge storage region, a control electrode (control gate electrode), a source region and a drain region. Also, It is possible to use a transistor with a floating gate electrode structure which uses the charge storage region as the floating gate electrode, and a transistor having a MONOS (Metal Oxide Nitride Oxide Silicon) structure which includes an electron trap region on a nitride film near an interface of with an oxide film in a memory cell MC. In the plurality of memory cells MC0-MCi the source region of one memory cell and the drain region of an adjacent memory cell are formed as one integrated part and both regions are shared. Then, the memory cell units MU0-MUj are formed by the plurality of memory cells MC0-MCi which are electrically connected in series, a source side selection transistor S1 which is electrically connected to a drain region and arranged in the source region of the memory cell MC0 of one end (source side) of the plurality of memory cells MC0-MCi and a drain side selection transistor S2 which is electrically connected to a source region and arranged in the drain region of the memory cell MCi of the other end (drain side) of the plurality of memory cells MC0-MCi.

Word lines WL0, WL1, ... WLi are respectively connected to a control electrode of each of the memory cells MC0-MCi. The word line WL0 is connected to the memory cell MC0 which is arranged in the same position in each of the memory cell units MU0-MUj, the word line WL1 is connected to the memory cell MC1 which is arranged in the same position and the remaining word lines are the same. A common source side selection gate line SGS in the memory cell array 2 is connected to a gate electrode of the source side selection transistor S1 of each of the memory cell units MU0-MUj. Similarly, a common drain side selection gate line SGD in the memory cell array 2 is connected to a gate electrode of the drain side selection transistor S2. Furthermore, a common cell source line CELSRC in the memory cell array 2 is connected to the source region of the source side selection transistor S1 of each of the memory cell units MU0-MUj, and bit lines BL0, BL1, . . . BLi, which are arranged corresponding to each of the memory cell units MU0-MUj, are each connected to the drain region of the drain side selection transistor S2 respectively.

[Multiple Exposure Method of a NAND Type Flash Memory]

Next, the multiple exposure method in the manufacturing method of the NAND type flash memory related to the first embodiment will be explained. First, the numerical value of the minimum processing dimension of each generation of NAND type flash memory is shown in FIG. 3. In the 70 nm generation NAND type flash memory, the minimum processing dimension of the cell region 11, that is, the line width which can be processed to a minimum dimension during manufacture is 70 nm. In the same generation, the minimum processing dimension of the connection region 12 (core region) is 70 nm and the minimum processing dimension of the peripheral circuit region 13 is 100 nm. In the 50 nm generation NAND type flash memory, the minimum processing dimension of the cell region 11 is 50 nm, the minimum processing dimension of the connection region 12 is 70 nm and the minimum processing dimension of the peripheral circuit region 13 is 100 nm.

However, in the next generation, the 40 nm generation of the NAND type flash memory, the minimum processing dimension of the cell region 11 is 40 nm, the minimum processing dimension of the connection region 12 is 50 nm and the minimum processing dimension of the peripheral circuit region 13 is 100 nm. In the next generation, the 30 nm generation of the NAND type flash memory, the minimum processing dimension of the cell region 11 is 30 nm, the minimum processing dimension of the connection region 12 is 40 nm and the minimum processing dimension of the peripheral circuit region 13 is 100 nm.

Figure 4:
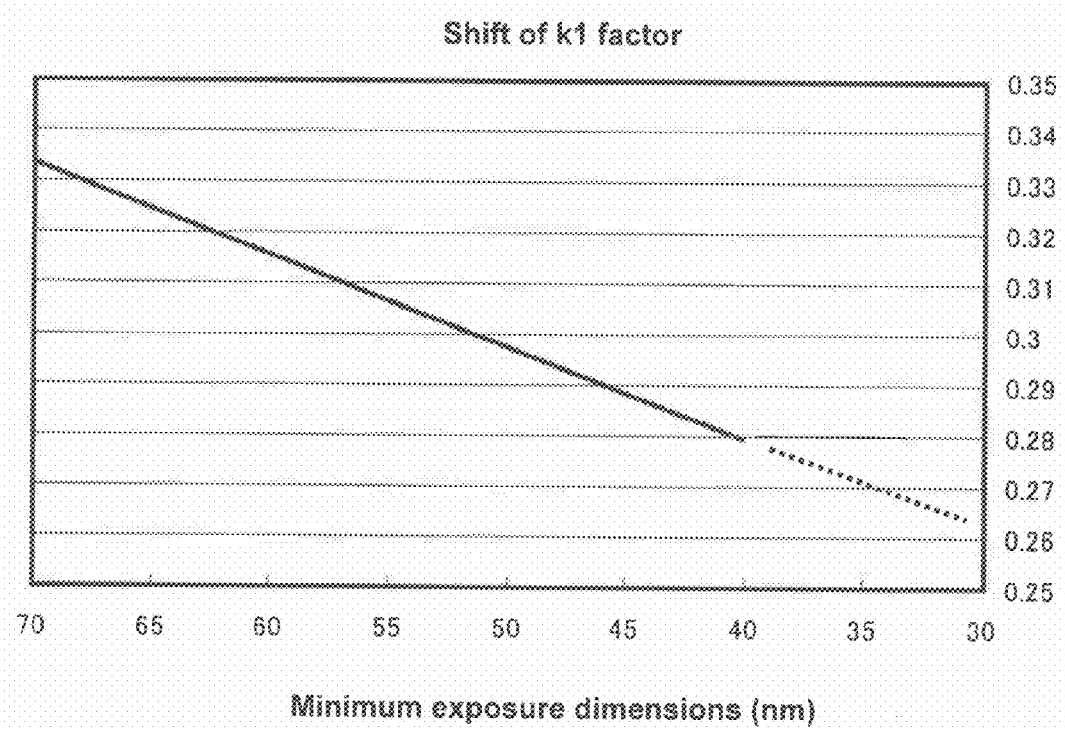
FIG. 4 is diagram which shows a shift of a k1 factor in an exposure method of a NAND type flash memory related to a first embodiment.

The k1 factor which shows the level of difficulty of the manufacture process of a semiconductor device is expressed by the formula stated above. The shift of this k1 factor tends to decrease as the minimum exposure dimensions become smaller as shown in FIG. 4.

Figure 5:
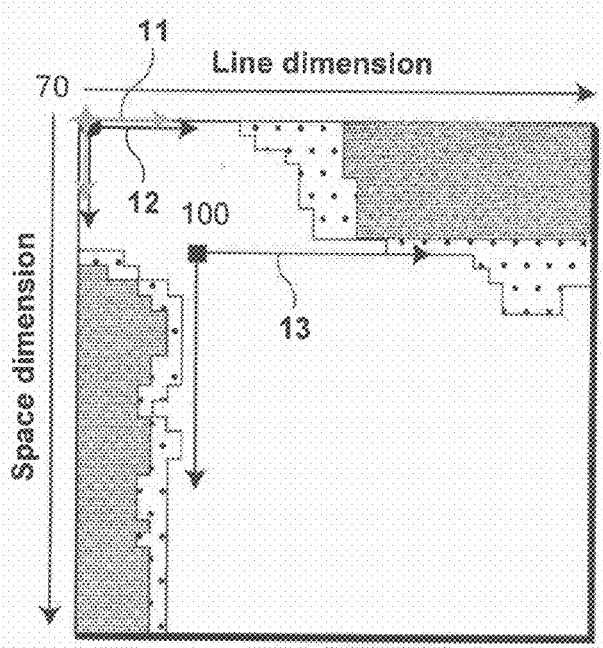
FIG. 5 is a diagram which shows an exposure margin related to an exposure method of a NAND type flash memory related to a first embodiment.

In the 70 nm generation of the NAND type flash memory, because it is possible to secure a sufficient exposure margin, it is possible to expose each of the cell region 11, the connection region 12 and the peripheral circuit region 13 in one shot, as shown in FIG. 5. The horizontal axis is the line dimension of the wiring group (wiring width dimension: nm) and the vertical axis is the space dimension (wiring space dimension: nm). A region in with no dots has a sufficient exposure margin and the exposure margin disappears as the number of dots increase. In other words, in the 70 nm generation of the NAND type flash memory, there is a sufficient exposure margin and it is possible to expose each of the cell region 11, the connection region 12 and the peripheral circuit region 13 in one shot.

Figure 6A:
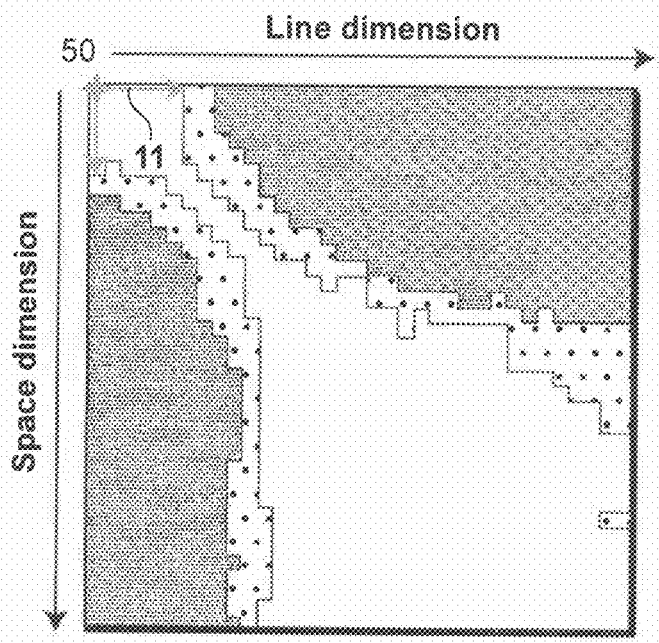
FIG. 6A is a diagram which shows an exposure margin related to an exposure method of a NAND type flash memory related to a first embodiment.
Figure 6B:
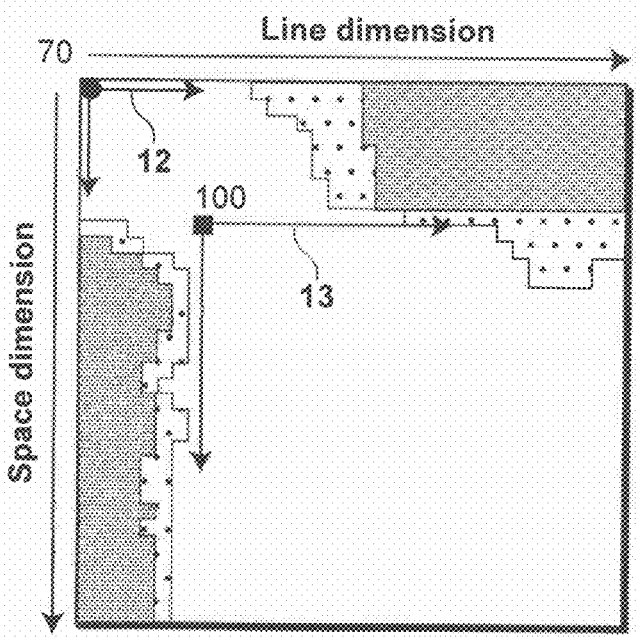
FIG. 6B is a diagram which shows an exposure margin related to an exposure method of a NAND type flash memory related to a first embodiment.

In the 50 nm generation of the NAND type flash memory, because the number of regions where it is possible to secure a sufficient exposure margin is few, exposure is performed with special exposure conditions only on the cell region 11 as shown in FIG. 6A. Exposure of the connection region 12 and the peripheral circuit region 13 is performed with different exposure conditions which can secure a sufficient exposure margin, as shown in FIG. 6B. That is, in the exposure method of the NAND type flash memory of the 50 nm generation, multiple exposure is performed twice, one exposure of the cell region 11 and one exposure of the connection region 12 and the peripheral circuit region 13.

[First Multiple Exposure Method]

Figure 7A:
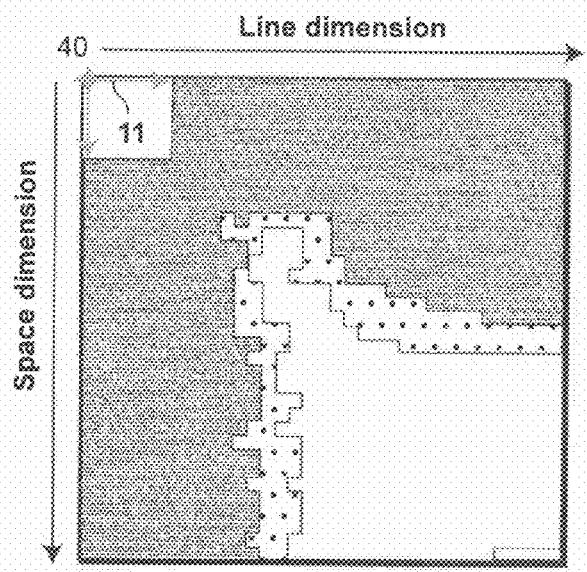
FIG. 7A is a diagram which shows an exposure margin related to a first exposure method of a NAND type flash memory related to a first embodiment.
Figure 7B:
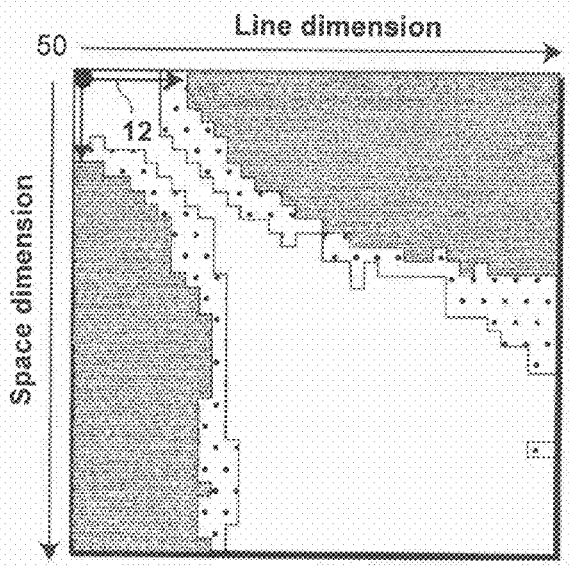
FIG. 7B is a diagram which shows an exposure margin related to a first exposure method of a NAND type flash memory related to a first embodiment.
Figure 7C:
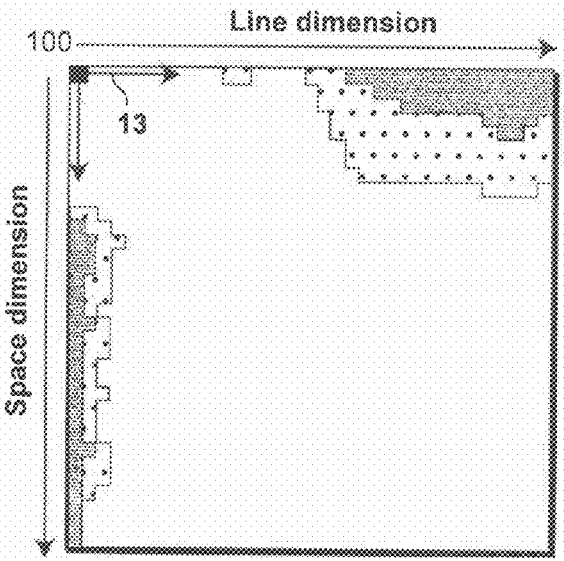
FIG. 7C is a diagram which shows an exposure margin related to a first exposure method of a NAND type flash memory related to a first embodiment.

In the NAND type flash memory 1 in generations following the 40 nm generation related to the first embodiment, because the number of regions in which a sufficient exposure margin can be secure is extremely small, exposure is performed with special exposure conditions only on the cell region 11 as is shown in FIG. 7A. Similarly, because the number of regions in which a sufficient exposure margin can be secured in the connection region 12 is few, exposure is also performed with special exposure conditions only on the connection region 12 as is shown in FIG. 7B. Exposure conditions which are different to those for the cell region 11 and the connection region 12 are used only with exposure of the peripheral circuit region 13 as is shown in FIG. 7C. That is, in the exposure method of the NAND type flash memory in generations following the 40 nm generation, because design rules can not be encompassed in mutual regions, multiple exposure is performed three times, one exposure of the cell region 11, one exposure of the connection region 12 and one exposure of the peripheral circuit region 13. That is, in FIG. 1, a total of three multiple exposures is performed; an exposure of the memory cell array 2 included in the cell region 11, an exposure of the sense amplifier 31, the sense amplifier 32, the row decoder 33 and the row decoder 34 included in the connection region 12 and an exposure of the power supply circuit, the temperature compensating circuit, and the clock generating circuit etc included in the peripheral circuit region 13. Here, [generations following a 40 nm generation] is used to mean including a generation which includes a 40 nm generation, a 30 nm generation and a generation having a minimum processing dimension slightly smaller than a 30 nm generation.

[Second Multiple Exposure Method]

Figure 8A:
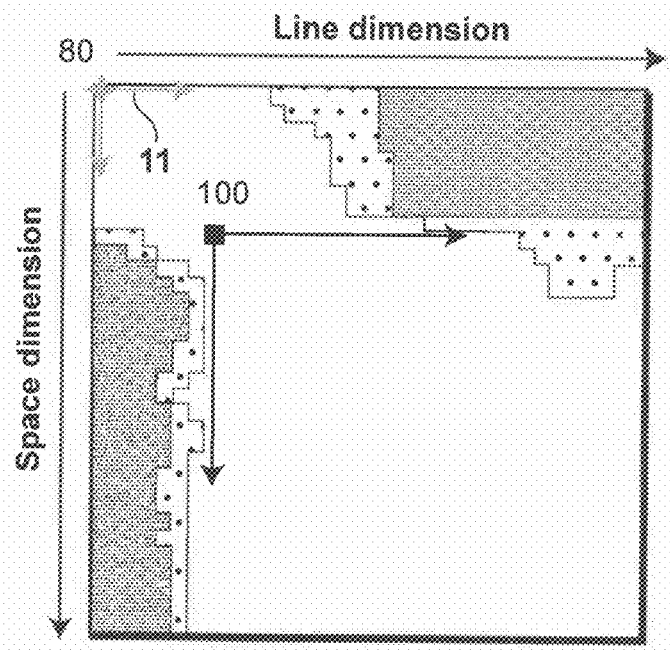
FIG. 8A is a diagram which shows an exposure margin related to a second exposure method of a NAND type flash memory related to a first embodiment.
Figure 8B:
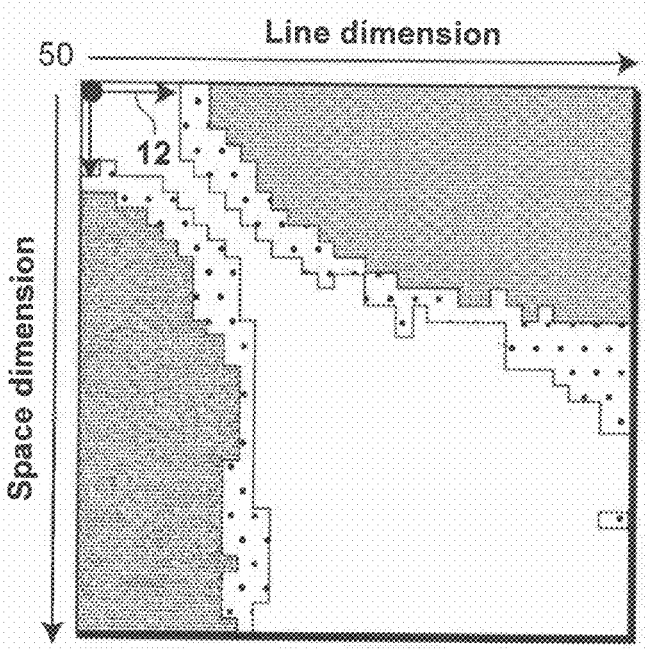
FIG. 8B is a diagram which shows an exposure margin related to a second exposure method of a NAND type flash memory related to a first embodiment.

In addition, in the NAND type flash memory 1 in generations following the 40 nm generation related to the first embodiment, in the case where a side wall processing process of the cell region 11 is adopted, the exposure dimensions of the cell region 11 may be, for example, twice the dimensions after side wall processing. Therefore, as is shown in FIG. 8A, it is possible to secure a sufficient exposure margin of the cell region 11 and it is possible to encompass the exposure conditions of the cell region 11 in the exposure conditions of the peripheral circuit region 13. By adopting the side wall processing process, the connection region 12 becomes the region with the minimum exposure dimensions and as is shown in FIG. 8B, because the number of regions in which a sufficient exposure margin can be secured is few, exposure is performed with special exposure conditions only on the connection region 12. That is, in the exposure method of the NAND type flash memory in generations following the 40 nm generation, in the case where a side wall processing process is adopted, because design rules can be encompassed in mutual regions, multiple exposure is performed twice, one exposure of the cell region 11 and the peripheral circuit region 13 and one exposure of the connection region 12. That is, as is shown in FIG. 9, a total of two multiple exposures is performed; one exposure of the memory cell array 2 included in the cell region 11, and the power supply circuit, the temperature compensating circuit, and the clock generating circuit etc included in the peripheral circuit region 13, and one exposure of the sense amplifier 31, the sense amplifier 32, the row decoder 33 and the row decoder 34 included in the connection region 12.

[Third Multiple Exposure Method]

Figure 10A:
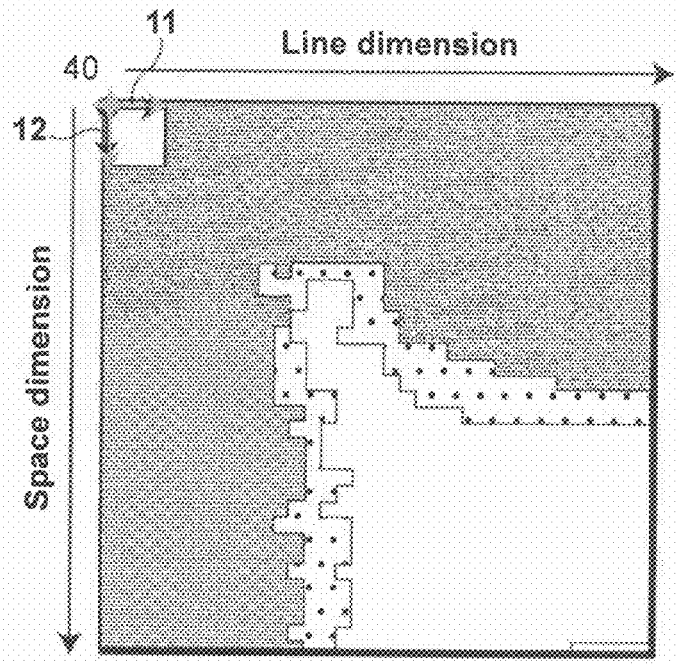
FIG. 10A is a diagram which shows an exposure margin related to a third exposure method of a NAND type flash memory related to a first embodiment.
Figure 10B:
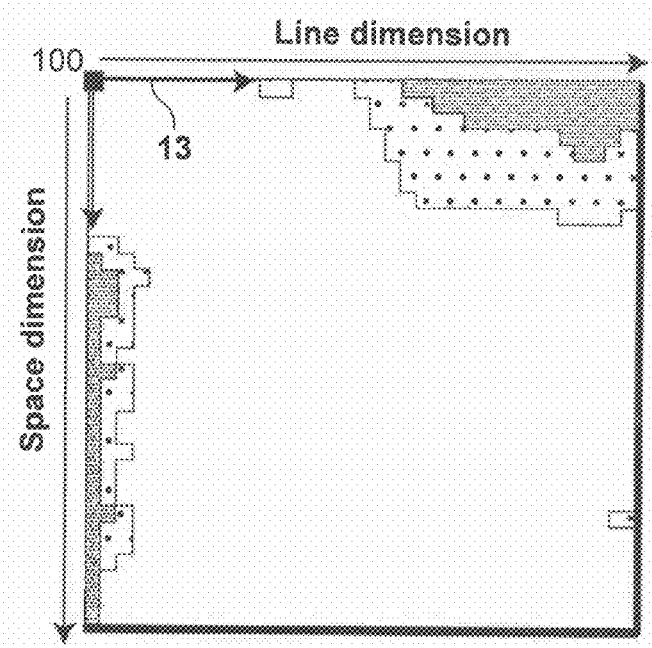
FIG. 10B is a diagram which shows an exposure margin related to a third exposure method of a NAND type flash memory related to a first embodiment.

In addition, in the NAND type flash memory 1 in generations following the 40 nm generation related to the first embodiment, in the case where it is possible to encompass either the cell region 11 or the connection region 12 within the other, within a range which can secure an extremely narrow exposure margin, It is possible to encompass the exposure conditions of the connection region 12 within the exposure conditions of the cell region 11 as is shown in FIG. 10A. As is shown in FIG. 10B, exposure is performed only on the peripheral circuit region 13 with different exposure conditions to the exposure conditions of the cell region 11 and the connection region 12. That is, in the exposure method of the NAND type flash memory in generations following the 40 nm generation, because design rules can be encompassed in mutual regions of the cell region 11 and the connection region 12, multiple exposure is performed twice, one exposure of the cell region 11 and the connection region 12 and one exposure of the peripheral circuit region 13. That is, as is shown in FIG. 11, a total of two multiple exposures is performed; one exposure of the memory cell array 2 included in the cell region 11, and the sense amplifier 31, the sense amplifier 32, the row decoder 33 and the row decoder 34 included in the connection region 12, and one exposure of and the power supply circuit, the temperature compensating circuit, and the clock generating circuit etc included in the peripheral circuit region 13.

In addition, one example of a minimum dimension in the cell region 11 (first region) within the NAND type flash memory 1 shows in FIG. 1 in the above stated first embodiment, is shown in FIG. 15. FIG. 15 is a diagram which shows an enlarged view of one part of a layout within the memory cell array 2 included in the cell region 11. In this case, the minimum line width within the memory cell array 2 is the bit line width W1 of a bit line BL or the word line width W2 of a word line WL.

Figure 16:
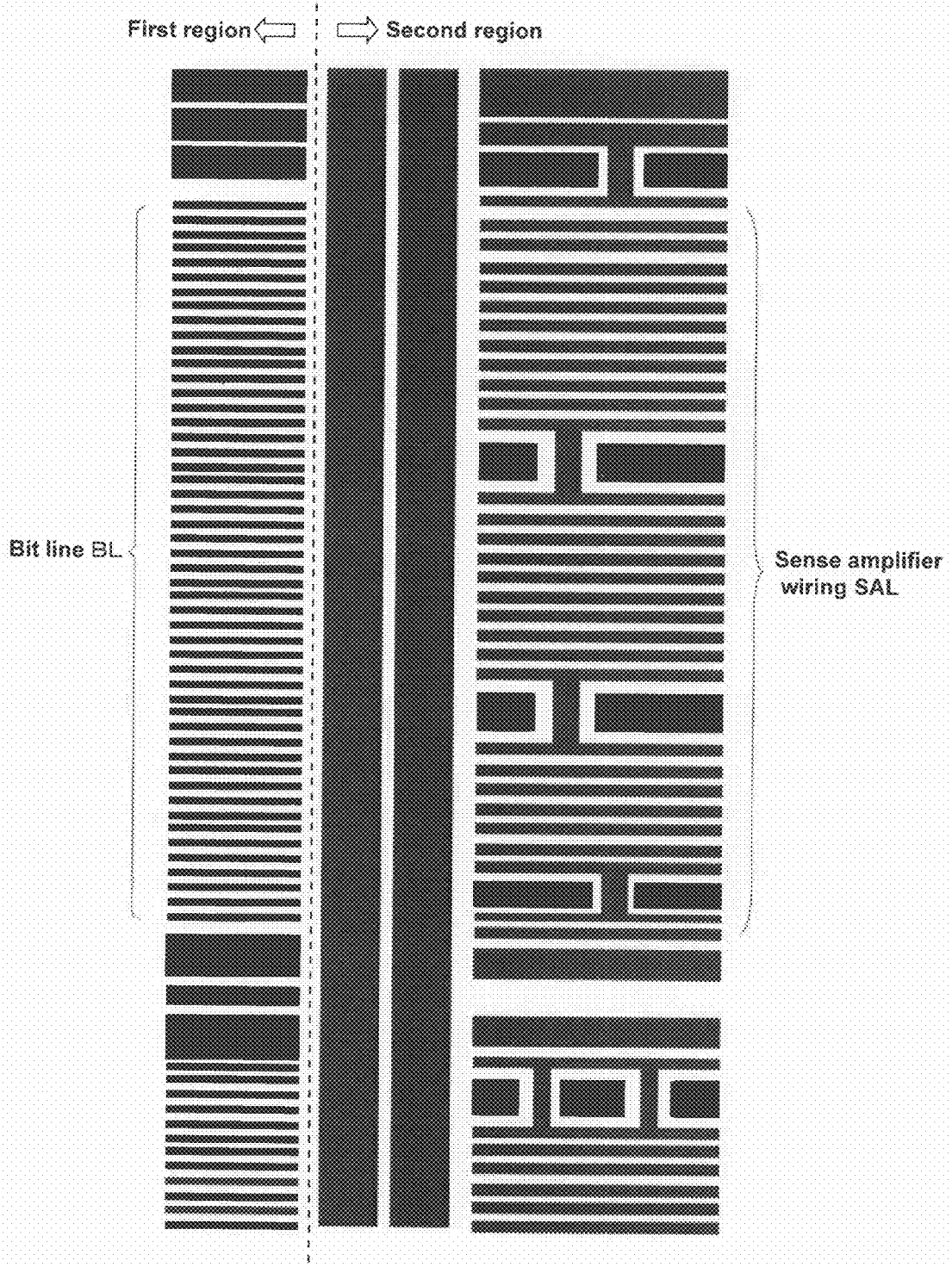
FIG. 16 is a diagram which shows one example of a minimum dimension within a connection region of a NAND type flash memory related to a first embodiment.

Next, one example of a minimum dimension in the connection region 12 (second region) within the NAND type flash memory 1 shows in FIG. 1 in the above stated first embodiment, is shown in FIG. 16. FIG. 16 is diagram which shows an enlarged view of part of a layout within the memory cell array 2 included in the cell region 11 and an enlarge view of one part of a layout in the sense amplifier 32 included in the connection region 12. The bit line BL within this memory cell array 2 and the sense amplifier wiring SAL within the sense amplifier 32 are formed on the same layer (for example, layer M1). In this case, the minimum line width within the sense amplifier 32 is the sense amplifier wiring SAL which is formed on the same layer as a bit line BL. In addition, in the case where a side wall processing process is adopted, the sense amplifier wiring SAL may be, for example, twice the dimension after side wall processing in the exposure method of the connection region 12. In addition, the sense amplifier wiring SAL in the sense amplifier 31 is formed to a minimum line width by adopting the side wall processing process the same as the sense amplifier 32.

Figure 17:
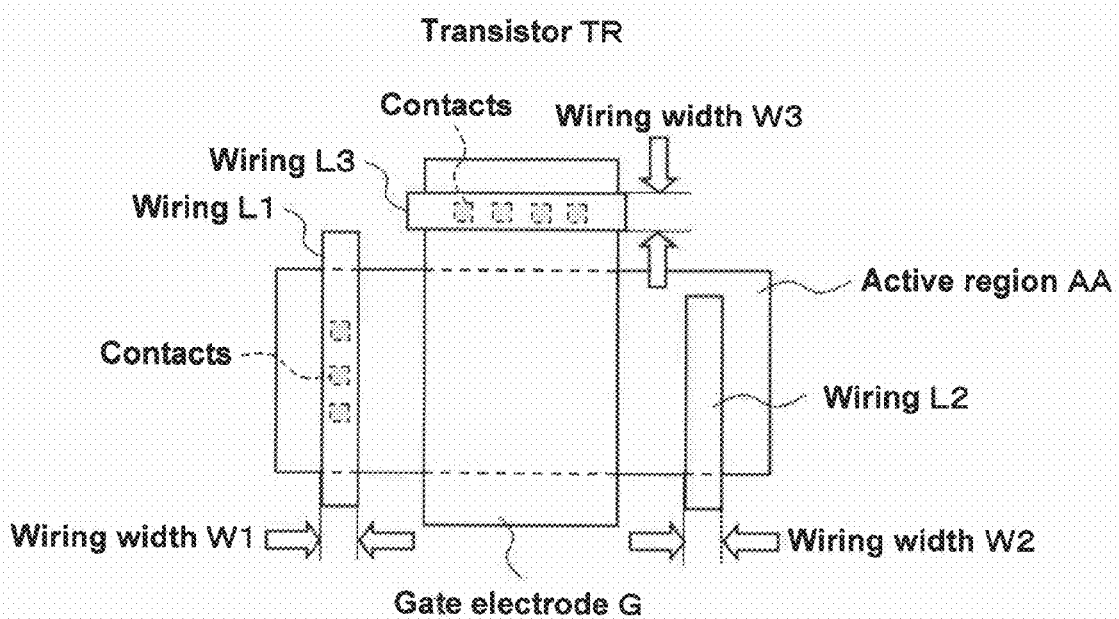
FIG. 17 is a diagram which shows one example of a minimum dimension within a peripheral circuit region of a NAND type flash memory related to a first embodiment.

Next, one example of a minimum dimension in the peripheral circuit region 13 (third region) within the NAND type flash memory 1 shown in FIG. 1 in the above stated first embodiment is shown in FIG. 17. FIG. 17 is a diagram which shows an expanded view of a transistor TR arranged within the peripheral circuit region 13. In this transistor TR, an active region AA which includes a source electrode and a drain electrode is formed on the lowest layer and a gate electrode G is formed on a layer above. A wiring L1 is connected via a plurality of contacts in the active region AA shown on the left side of the diagram and a wiring L2 shown on the right side of the diagram is also connected. In addition, a wiring L3 shown on upper side of the diagram is connected via contacts in the gate electrode G. The wirings L1, L2 and L3 are formed on the same layer (for example, layer M0). In this case, the minimum line width within the peripheral circuit region 13 is the wirings L1, L2 and L3 (wiring width W1, W2 and W3).

As explained above, in the NAND type flash memory 1 related to the first embodiment, even in the case where the exposure dimension and the dimension variation allowable value are independent, it is possible to realize multiple exposure which fulfills the demand for accurate dimensions of a pattern. That is, in the manufacturing process of the NAND type flash memory 1, even in the case where the k1 factor which shows a level of difficulty, is small and a pattern has a strict exposure margin, it is possible to realize multiple exposure in a state where an exposure margin is secured.

Second Embodiment

The second embodiment of the present invention explains an example in which the space occupied by a multiple exposure boundary region is reduced in the NAND type flash memory 1 related to the above stated first embodiment. Furthermore, in the second embodiment and all following embodiments, the same structure of the NAND type flash memory 1 related to the first embodiment has the same symbols and repeated and overlapping explanations are omitted.

[Layout Structure of the NAND Type Flash Memory]

The NAND type flash memory 1 (semiconductor device) related to the second embodiment of the present invention shown in FIG. 12, is arranged with a cell region 11, a peripheral circuit region 13 arranged on the periphery region of the cell region 11, and a connection region 12 arranged between the cell region 11 and the peripheral circuit region 13, the same as in the NAND type flash memory 1 related to the first embodiment.

In FIG. 12, the region enclosed by a dotted line is the cell region 11 (first region). The cell region 11 is a region in which memory cells are arranged in matrix in a memory cell array 2. In FIG. 12, the region which is enclosed by a single dot dashed line is the connection region 12 (second region). The connection region 12 includes a sense amplifier 31 and a sense amplifier 32 of the NAND type flash memory 1 which are arranged along the top area of the memory cell array 2 and the bottom area which faces the top area respectively. In the first embodiment, a row decoder 33 and a row decoder 34 of the NAND type flash memory 1 were arranged along the left area of the memory cell array 2 and the right area which faces the left area respectively in the connection region 12. In the second embodiment the row decoder 33 and the row decoder 34 are not included. It is possible to expose the row decoder 33 and the row decoder 34 with the same exposure conditions as the peripheral circuit region 13 exposure conditions, by relaxing the minimum processing dimensions of a line and space of the wiring group of the row decoder 33 and the row decoder 34. In FIG. 12, the region which is enclosed by a two-dot dashed line excluding the cell region 11 and the connection region 12 is the peripheral circuit region 13 (third region). The peripheral circuit region 13 is arranged on the periphery of the connection region 12 and includes the row decoder 33 and the row decoder 34, a power supply circuit (including a charge pump circuit and step-down circuit), a temperature compensating circuit and a clock generator circuit of the NAND type flash memory 1.

[Boundary Region Structure of the NAND Type Flash Memory]

Figure 13A:
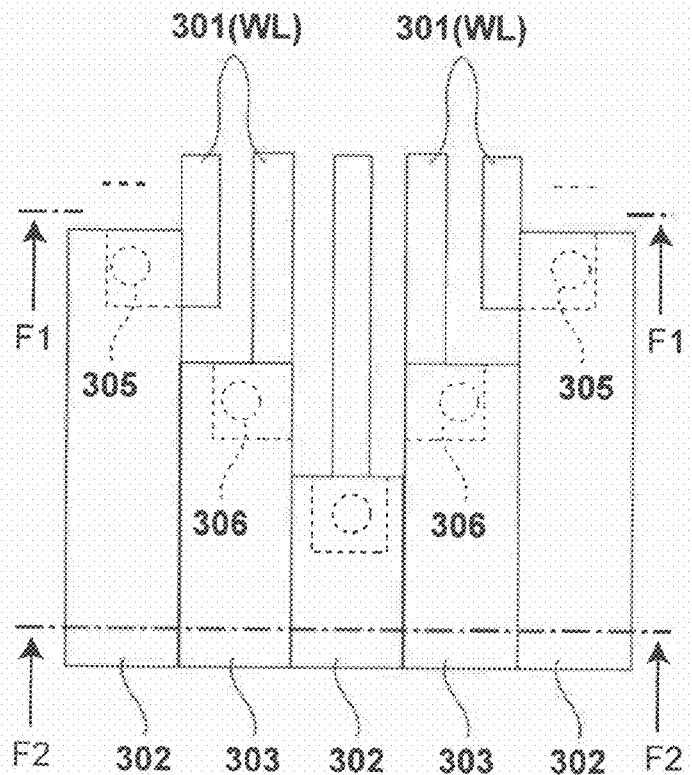
FIG. 13A is planar diagram of the main parts of the NAND type flash memory shown in FIG. 12.
Figure 13B:
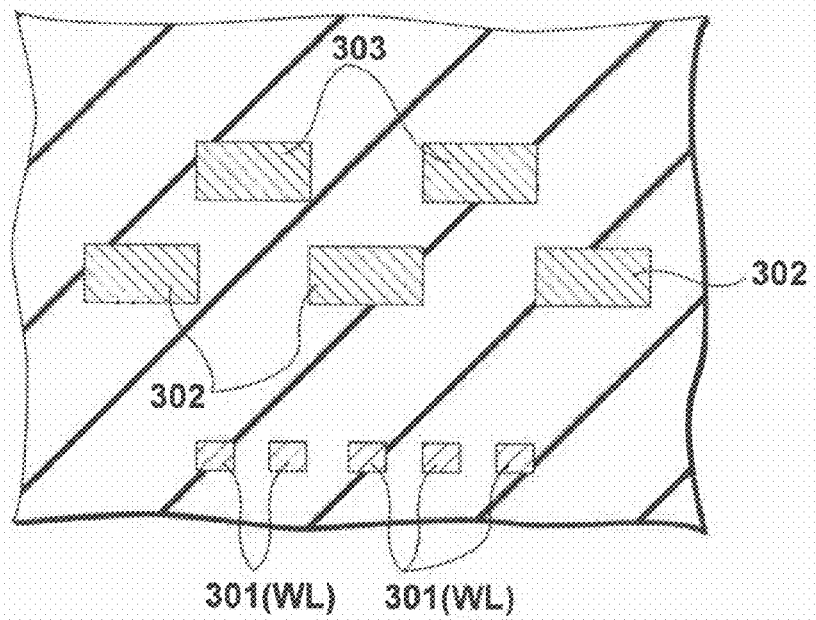
FIG. 13B is cross sectional diagram of the cross sectional lines F1-F1 and F2-F2 shown in FIG. 13A.

In the memory cell array 2 (cell region 11) in the NAND type flash memory 1, a plurality of word lines (WL) 301 are arranged in rows at a minimum processing dimension, that is, at a minimum line width and minimum space width, as shown in FIG. 13A and FIG. 13B. In the second embodiment, a gate electrode material is used for the word lines 301. Specifically, a single layer film of either a silicon polycrystalline film, high melting point metal film or high melting point metal silicide film, or a compound film of a high melting point metal film or a high melting point metal silicide film stacked on a silicon polycrystalline film is used. Furthermore, although not shown in the diagram, there is a semiconductor substrate (for example, silicon monocrystal substrate) below the word lines 301 in FIG. 13B.

The word lines 301 which have a line and space in this cell region 11, are electrically connected to the row decoder 33 and the row decoder 34 via a wiring 302 and a wiring 303 in which have a relaxed exposure dimension (design rule). The wirings 302 and 303 are arranged on a wiring layer higher than the word line 301, and are formed for example from an aluminum wiring. The aluminum wiring may be a stacked layer which includes a single layer film or a lower layer of barrier metal and an upper layer of an antireflection film. In the second embodiment, the wirings 302 and 303 have an arrangement pitch which is twice of more the arrangement pitch of the word line 301. Furthermore, each of the wirings 302 and 303 are divided into two layers. In other words, the wirings 302 and 303 can be effectively arranged without an intervening space while the wiring width is widened.

Figure 18:
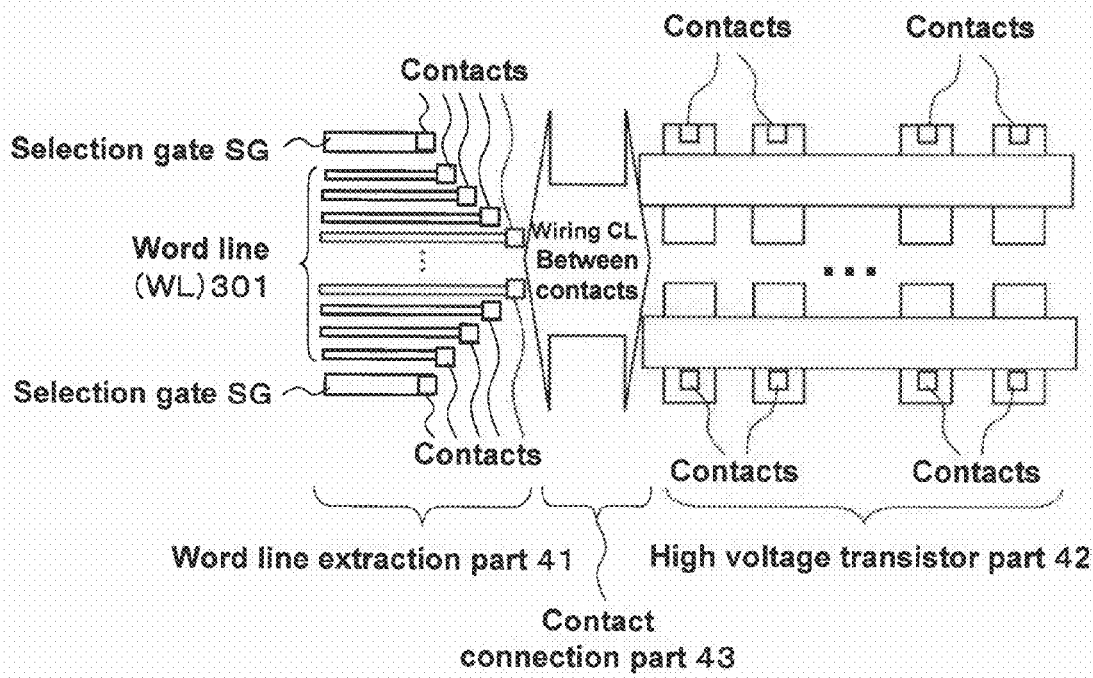
FIG. 18 is a diagram which shows one example of a minimum dimension within a peripheral circuit region of a NAND type flash memory related to a second embodiment.

Next, one example of a minimum width in the peripheral circuit region 13 (third region) within the NAND type flash memory shown in FIG. 12 in the above stated second embodiment is shown in FIG. 18. FIG. 18 is a diagram which shows an enlarged view of one part of a layout within the row decoder 34 included in the peripheral circuit region 13. This row decoder 34 includes a selection gate SG arranged on the cell region 11 and a word line extraction part 41 which extracts a word line (WL) 301 (see FIGS. 13A and 13B), a high voltage transistor part 42 in which a plurality of high voltage transistors are arranged, and a contact connection part 43 which connects a contact within the word line extraction part 41 and a contact within the high voltage transistor part 42. In this case, the minimum line width within the peripheral circuit region 13 is the wiring CL between contacts which is arranged in the contact connection part 43.

Therefore, in the second embodiment, the row decoder 33 and the row decoder 34 can be exposed with the exposure conditions of the peripheral circuit region 13 which has relatively relaxed exposure conditions. In other words, there is no need to make the entire periphery of the row decoder 33 and 34 which is the connection region 12 a boundary region. The boundary region is only the area between the left side of the memory cell array 2, which is the cell region 11, and the row decoder 33, and between the right side of the memory cell array 2 and the row decoder 34. When the boundary region increases, it is not possible to effectively use the area of the NAND type flash memory 1. In the second embodiment, because the boundary region of the periphery circuit region 13 with the row decoder 33 and 34 is removed, it is possible to control an increase in chip area by multiple exposure.

Third Embodiment

The third embodiment of the present invention explains an example of the NAND type flash memory 1 related to the first embodiment or the second embodiment, in which the area occupied by a multiple exposure boundary of each of a plurality of layers is reduced.

[Outline Structure of a Boundary of a Layer Region of the NAND Type Flash Memory]

In the case where two or more wiring layers, layers 61 and 62 exist in the NAND type flash memory 1 (semiconductor device) related to the third embodiment of the present invention as shown in FIG. 14, multiple exposure layers boundary regions 601 and 602 are alternatively arranged from a lower layer to an upper layer. In other words, a boundary 602 of a region of a layer 62 (for example, layer M1) above a layer 61 (for example, layer M0) is separated at a fixed interval from a boundary 601 of a region of the layer 61. In addition, the boundary 601 of the region of the layer 61 and the boundary 602 of the region of a layer 62 are sectioned by a width of twice or more a minimum processing dimension which exists in an adjacent region.

In the NAND type flash memory 1 which is structured in this way, it is possible to secure a connection region between upper and lower wirings in a space between the boundary 601 of a region of the multiple exposure layer 61 and the boundary 602 of a region of the multiple exposure layer 62. Furthermore, in the third embodiment, a two layer region was explained, however, even in three layers a region of a layer further above the region 601 is arranged to overlap directly above the region 601 of the layer 61. In this case, it is possible to reduce the occupied area necessary in a boundary region by overlapping with the region 601 of the layer 61.

Fourth Embodiment

The fourth embodiment of the present invention, explains an example of an enlarged occupied area in a multiple exposure boundary in each of a plurality of layers in the NAND type flash memory 1 related to the first, second or third embodiments stated above. Furthermore, in the second embodiment and all following embodiments, the same structure as the NAND type flash memory 1 related to the first embodiment has the same symbols and thus any repeated and overlapping explanation is omitted.

[Layout Structure of the NAND Type Flash Memory]

Figure 19:
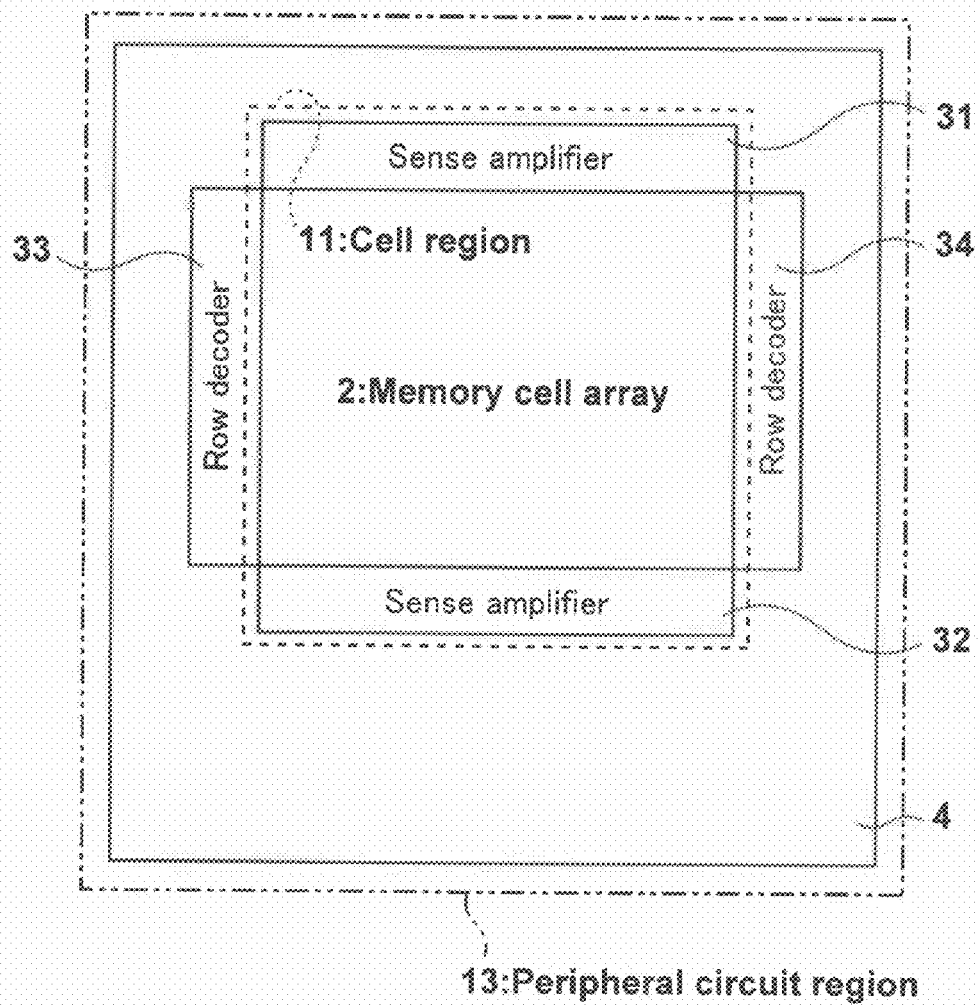
FIG. 19 is layout diagram of a NAND type flash memory chip related to a fourth embodiment of the present invention.

The NAND type flash memory 1 (semiconductor device) related to the fourth embodiment of the present invention shown in FIG. 19, is arranged with a cell region 11, a peripheral circuit region 13 arranged on the periphery region of the cell region 11, the same as in the NAND type flash memory 1 related to the first embodiment.

In FIG. 19, the region enclosed by a dotted line is the cell region 11 (first region). The cell region 11 is a region which includes memory cells arranged in matrix in a memory cell array 2, a sense amplifier 31 and a sense amplifier 32 of the NAND type flash memory 1 arranged along the upper side and the lower side which faces the upper side of the memory cell array 2. In FIG. 19, the region which is enclosed by a two-dot dashed line excluding the cell region 11 is the peripheral circuit region 13 (second region). The peripheral circuit region 13 is arranged on the periphery of the cell region 11 and includes the row decoder 33 and 34, a power supply circuit (including a charge pump circuit and step-down circuit), a temperature compensating circuit and a clock generator circuit of the NAND type flash memory 1.

In the first embodiment, the above stated sense amplifiers 31 and 32, and the row decoders 33 and 34 of the NAND type flash memory 1 arranged along the left side of the memory cell array 2 and the right side of the memory cell array 2 respectively, were arranged as the connection region 12. In the fourth embodiment, the cell region 11 is expanded so to include the sense amplifiers 31 and 32, and the peripheral circuit region 13 is expanded to include the row decoders 33 and 34. As a result, in the fourth embodiment, the connection region 12 is not included as an object of multiple exposure.

In the cell region 11, the memory cell array 2 and the sense amplifiers 31 and 32 become the minimum exposure dimension by adopting the above stated side wall processing process. In this case, in the memory cell array 2 in the cell region 11, the part which becomes the minimum processing dimension, for example, is the minimum line width within the memory cell array 2 shown in FIG. 15 stated above, and the bit line width W1 of a bit line BL or the word line width W2 of a word line WL. In addition, in the sense amplifiers 31 and 32 in the cell region 11, the part which becomes the minimum processing process dimension, for example, is the sense amplifier wiring SAL which is formed on the same layer as a bit line BL within the sense amplifier 32 shown in FIG. 16 stated above. In this way, because the region in which an exposure margin can be sufficiently secured is expanded, exposure is performed with special exposure conditions only on the cell region 11. In addition, it is possible to expose the row decoder 33 and the row decoder 34 with the same exposure conditions as the peripheral circuit region 13 exposure conditions, by relaxing the minimum processing dimensions of a line and space of the wiring group of the row decoder 33 and the row decoder 34.

That is, the exposure method of the NAND type flash memory in generations following a 40 nm generation, in the case where a side wall processing process is adopted, because it is possible to encompass the design rules in mutual regions, multiple exposure is performed twice, one exposure of the cell region 11 and one exposure of the peripheral circuit region 13. That is, as is shown in FIG. 19, a total of two multiple exposures is performed; one exposure of the sense amplifiers 31 and 32 and the memory cell array 2 included in the cell region 11, and one exposure of the power supply circuit, the temperature compensating circuit, the clock generating circuit etc and the row decoder 33 and the row decoder 34 included in the peripheral region 13.

Therefore, in the fourth embodiment, the memory cell array 2 and the sense amplifiers 31 and 32 can be exposed with the exposure conditions of the cell region 11 and the row decoder 33 and the row decoder 34 can be exposed with the exposure conditions of the peripheral circuit region 13 which has relatively relaxed exposure conditions. In other words, there is no need to set a connection region 12 between the cell region 11 and the peripheral circuit region 13. The boundary region is only the area between the left and right side of the memory cell array 2, which is the cell region 11, and the peripheral circuit region 13, and between the upper side of the sense amplifier 31 or the bottom side of the sense amplifier 32 and the peripheral circuit region 13. When the boundary region increases, it is not possible to effectively use the area of the NAND type flash memory 1. In the fourth embodiment, because the connection region is removed and the boundary region is reduced, it is possible to control an increase in chip area by multiple exposure.

Other Embodiments

The present invention is not limited to the above stated embodiments. For example, the above stated embodiments explained a NAND type flash memory, however the present invention can be applied to a NOR type flash memory, or another memory device such as a DRAM or SRAM. Furthermore, in the present invention a row decoder 33 and a row decoder 34 was included in the second region (connection region) in the NAND type flash memory, however, a column decoder may be included in addition to a row decoder in each of a NOR type flash memory, DRAM or SRAM. Furthermore, the present invention can be applied to a logic device in which multiple exposure technology is applied In addition, the layout structure of the NAND type flash memory 1 shown as an example in each of the embodiment stated above is not limited to these embodiments. That is, the circuit structure which is included in each of the cell region 11 (first region), the connection region 12 (second region) the peripheral circuit region 13 (second region, third region), is not limited to the circuit or wiring etc shown as an example in the above stated four embodiments. For example, a boundary on which multiple exposure is performed, may be appropriately changed according to a layer or layout etc in which each component structure within the chip is formed. Furthermore, the boundary of a region on which multiple exposure is performed, may be sectioned by a voltage supplied by each circuit. For example, a voltage supplied to a bit line of the cell region may be 0-25 V, a voltage supplied to word line of a the cell region and to a row decoder may be 0-30 V and a voltage supplied to a sense amplifier may be 0-5 V. The boundary of a region on which multiple exposure is performed may be sectioned by the differences in these supplied voltages. In addition, in the case where the above stated side wall processing is adopted, the space between wirings is fixed and wiring dimensions (wiring width) has the characteristic of being varied. The boundary of a region on which multiple exposure is performed maybe sectioned by utilizing this characteristic of this side wall process. For example, in the case where side wall processing is adopted for the cell region, the bit line or the word line wiring pattern within the cell region takes on the characteristics of the side wall process. In addition, when the side wall process is adopted for the sense amplifier or the row decoder, the wiring pattern within the sense amplifier or the row decoder also takes on the characteristics of the side wall process.

What is claimed is:

1. A semiconductor device comprising:
   a first region having a first pattern, said first pattern having a first minimum dimension; and
   a second region having a second pattern, said second pattern having a second minimum dimension which is larger than said first minimum dimension, said second region being arranged adjacent to said first region, a boundary of said first region and said second region being sectioned by a width twice or more of a minimum dimension which exists in an adjacent region.

2. The semiconductor device according to claim 1, wherein a memory cell array and a sense amplifier of said memory cell array are arranged in said first region, and a decoder of said memory cell array and a power supply circuit are arranged in said second region.

3. The semiconductor device according to claim 1, wherein said boundary separates said first region from said second region as a closed region.

4. The semiconductor device according to claim 1, wherein said first pattern is formed by adopting a side wall processing process.

5. The semiconductor device according to claim 4, wherein a space between wirings is fixed and a width of each wiring is different in said first pattern which is formed by adopting said side wall processing process.

6. The semiconductor device according to claim 1, wherein the maximum value of each voltage supplied to said first region and said second region are different.

7. The semiconductor device according to claim 2, wherein said memory cell array is arranged with a plurality of nonvolatile memory cells.

8. A semiconductor device comprising:
a first region having a first pattern, said first pattern having a first minimum dimension;
a second region having a second pattern, said second pattern having a second minimum dimension which is larger than said first minimum dimension, said second region being arranged adjacent to said first region; and
a third region having a third pattern, said third pattern having a third minimum dimension which is larger than said second minimum dimension, said third region being arranged adjacent to said first region or said second region, a boundary of said first region, said second region and said third region being one of the following;
(1) a boundary of each of said first region, said second region and said third region being sectioned by a width which is twice or more of a minimum dimension which exists in a region adjacent to said boundary
(2) a boundary of said first region and said third region with said second region is sectioned by a width which is twice or more of a minimum dimension which exists in a region adjacent to said boundary
(3) a boundary of said first region and said second region with said third region is sectioned by a width which is twice or more of a minimum dimension which exists in a region adjacent to said boundary.

9. The semiconductor device according to claim 8, wherein a memory cell array is arranged in said first region, a decoder of said memory cell array and a sense amplifier are arranged in said second region and a decoder of said memory cell array and a power supply circuit are arranged in said third region.

10. The semiconductor device according to claim 8, wherein a memory cell array is arranged in said first region, a sense amplifier of said memory cell array is arranged in said second region and a decoder of said memory cell array and a power supply circuit are arranged in said third region.

11. The semiconductor device according to claim 8, wherein said boundary separates said first region from said second region as a closed region, and said boundary separates said second region from said third region as a closed region.

12. The semiconductor device according to claim 8, wherein said first pattern is formed by adopting a side wall processing process.

13. The semiconductor device according to claim 12, wherein a space between wirings is fixed and a width of each wiring is different in said first pattern which is formed by adopting said side wall process.

14. The semiconductor device according to claim 8, wherein said memory cell array is arranged with a plurality of nonvolatile memory cells.

15. The semiconductor device according to claim 8, wherein the maximum value of each voltage supplied to said first region, said second region and said third region are different.

* * * * *